US012754634B2

(12) United States Patent
Ono et al.

(10) Patent No.: US 12,754,634 B2
(45) Date of Patent: Oct. 6, 2026

(54) SENSOR CONTROLLER, ELECTRONIC DEVICE, AND CONTROL METHOD OF SENSOR CONTROLLER

(71) Applicant: Wacom Co., Ltd., Saitama (JP)

(72) Inventors: Kenichi Ono, Saitama (JP); Paiching Hsiao, Saitama (JP); Yoshio Nomura, Saitama (JP); Yuhi Hatano, Saitama (JP)

(73) Assignee: Wacom Co., Ltd., Saitama (JP)

(*) Notice: Subject to any disclaimer, the term of this patent is extended or adjusted under 35 U.S.C. 154(b) by 0 days.

(21) Appl. No.: 19/338,675

(22) Filed: Sep. 24, 2025

(65) Prior Publication Data

US 2026/0016915 A1 Jan. 15, 2026

Related U.S. Application Data

(63) Continuation of application No. 18/914,651, filed on Oct. 14, 2024, now Pat. No. 12,449,933.

(30) Foreign Application Priority Data

Oct. 16, 2023 (JP) ................................ 2023-178043

(51) Int. Cl.
*G06F 3/041* (2006.01)
*G01R 27/26* (2006.01)

(52) U.S. Cl.
CPC ..... *G06F 3/04166* (2019.05); *G01R 27/2605* (2013.01); *G06F 3/0418* (2013.01)

(58) Field of Classification Search
CPC ............... G06F 3/04166; G06F 3/0418; G01R 27/2605
See application file for complete search history.

(56) References Cited

U.S. PATENT DOCUMENTS

| | | | |
|---|---|---|---|
| 10,627,957 B2 | 4/2020 | Khazeni et al. | |
| 10,686,432 B2 | 6/2020 | Roberson et al. | |
| 11,159,150 B2 | 10/2021 | Roberson et al. | |
| 11,550,434 B2 * | 1/2023 | Ding | G06F 3/044 |
| 2017/0269778 A1 | 9/2017 | Khazeni | |
| 2018/0239493 A1 | 8/2018 | Khazeni et al. | |

(Continued)

FOREIGN PATENT DOCUMENTS

JP 5496735 B2 5/2014

*Primary Examiner* — Michael Pervan

(74) *Attorney, Agent, or Firm* — Seed Intellectual Property Law Group LLP

(57) ABSTRACT

A sensor controller that controls a touch sensor detects a position of a passive pointer. The sensor controller includes a transmission circuit that transmits a transmission signal to the touch sensor in a plurality of third periods, each including a first period for measuring electromagnetic noise and a second period for detecting the position of the passive pointer and a processor configured to measure a level of electromagnetic noise at a frequency associated with the first period and a frequency associated with the second period, and select, as a scan frequency of the transmission signal in the second period, the frequency associated with the first period or the frequency associated with the second period according to a measurement result of the level of the electromagnetic noise at the frequency associated with the first period and the level of the electromagnetic noise at the frequency associated with the second period.

11 Claims, 5 Drawing Sheets

(56) References Cited

U.S. PATENT DOCUMENTS

| | | | | |
|---|---|---|---|---|
| 2020/0067495 | A1 | 2/2020 | Roberson et al. | |
| 2020/0266805 | A1 | 8/2020 | Roberson et al. | |
| 2022/0121298 | A1 * | 4/2022 | Ding ...................... | H03G 3/344 |

* cited by examiner

SENSOR CONTROLLER, ELECTRONIC DEVICE, AND CONTROL METHOD OF SENSOR CONTROLLER

BACKGROUND

Technical Field

The present disclosure relates to a sensor controller, and particularly, to a sensor controller, an electronic device, and a control method of the sensor controller.

Description of the Related Art

Conventionally, a touch sensor that detects a position indicated by a finger, a stylus, or the like and a sensor controller that controls a detection operation of the touch sensor are known. An electronic device including the touch sensor and the sensor controller transmits a transmission signal with a scan frequency from the sensor controller to the touch sensor to detect the position.

In relation to this, an indicator position detection apparatus (sensor controller) is disclosed in Japanese Patent No. 5496735, the indicator position detection apparatus including a plurality of conductor patterns (touch sensors) arranged in directions crossing each other, a signal supply circuit that transmits a signal to the conductor pattern arranged in a first direction, and a noise analysis circuit that analyzes the frequency of a noise signal received by the conductor pattern arranged in a second direction and that detects and analyzes noise components.

In the technique described in Japanese Patent No. 5496735, the sensor controller needs to analyze the frequency to analyze the noise components. Therefore, the circuit scale and the manufacturing cost may increase in the technique described in Japanese Patent No. 5496735 due to the circuit that analyzes the frequency.

Even if the sensor controller is configured to analyze the noise components without analyzing the frequency in the technique described in Japanese Patent No. 5496735, the sensor controller described in Japanese Patent No. 5496735 determines the frequency of the transmission signal according to the result of frequency analysis at one frequency. Therefore, the sensor controller changes the frequency of the transmission signal to another frequency even when the level of noise at the analyzed frequency is lower than the level of noise at the other frequency. As a result, there is a possibility that the sensor controller changes the frequency of the transmission signal to be transmitted to the touch sensor to a frequency with a high level of noise in the technique described in Japanese Patent No. 5496735.

BRIEF SUMMARY

The present disclosure has been made in view of the problem, and an object of the present disclosure is to provide a sensor controller that can highly efficiently lower a level of electromagnetic noise of a transmission signal to be transmitted to a touch sensor.

To solve the problem, according to a first aspect of the disclosure, there is provided a sensor controller that controls an operation of a touch sensor that detects a position of a passive pointer, the sensor controller including a transmission circuit that, in operation, transmits a transmission signal to the touch sensor in a plurality of third period at a predetermined cycle, each of the third periods including a first period for measuring electromagnetic noise and a second period for detecting the position of the passive pointer, a processor, and a memory storing a program that, when executed by the processor, causes the processor to: measure a level of electromagnetic noise at a frequency associated with each of the first period and the second period, and select, as a scan frequency that is a frequency of the transmission signal in the second period, one of a first predetermined number of frequencies, and select, as backup frequencies that are frequencies of the transmission signal in the first period, a second predetermined number of frequencies fewer than the first predetermined number of frequencies from one or more frequencies different from the scan frequency among the first predetermined number of frequencies, in each third period and according to a measurement result of the level of the electromagnetic noise at the frequency associated with each of the first period and the second period.

According to a second aspect of the disclosure, there is provided the sensor controller, in which the program, when executed by the processor, causes the processor to sequentially select, as the backup frequencies, the second predetermined number of frequencies from the one or more frequencies different from the scan frequency among the first predetermined number of frequencies in each of the third periods.

According to a third aspect of the disclosure, there is provided the sensor controller, in which the program, when executed by the processor, causes the processor to select, as the scan frequency of a current time, one frequency different from the scan frequency selected a last time, if the measurement result of the level of the electromagnetic noise in the second period is equal to or higher than a predetermined value.

According to a fourth aspect of the disclosure, there is provided the sensor controller, in which the program, when executed by the processor, causes the processor to determine whether the measurement result is equal to or lower than the measurement result of the electromagnetic noise in the first period, if the measurement result is equal to or higher than the predetermined value, and again select, as the scan frequency of the current time, the scan frequency selected last time if the measurement result is determined to be equal to or lower than the measurement result of the electromagnetic noise in the first period.

According to a fifth aspect of the disclosure, there is provided the sensor controller, in which the program, when executed by the processor, causes the processor to determine whether the measurement result is equal to or lower than measurement results of the electromagnetic noise in a plurality of first periods, if the measurement result is equal to or higher than the predetermined value, and again select, as the scan frequency of the current time, the scan frequency selected the last time if the measurement result is determined to be equal to or lower than the measurement result of the electromagnetic noise in the first period.

According to a sixth aspect of the disclosure, there is provided the sensor controller, in which the program, when executed by the processor, causes the processor to determine whether the measurement result is equal to or lower than measurement results of the electromagnetic noise in a plurality of first periods, if the measurement result is equal to or higher than the predetermined value, and select, as the scan frequency of the current time, a frequency corresponding to the measurement result with a lowest value among the measurement results of the electromagnetic noise in the plurality of first periods if the measurement result is not determined to be equal to or lower than the measurement result of the electromagnetic noise in the first period.

According to a seventh aspect of the disclosure, there is provided the sensor controller, in which the program, when executed by the processor, causes the processor to determine whether the measurement result is equal to or lower than measurement results of the electromagnetic noise in a plurality of first periods, if the measurement result is equal to or higher than the predetermined value, and select, as the scan frequency of the current time, a frequency with a highest priority in relation to priorities set in advance according to preliminary measurement results related to the level of the electromagnetic noise, from the one or more frequencies different from the scan frequency among the first predetermined number of frequencies if the measurement result is not determined to be equal to or lower than the measurement result of the electromagnetic noise in the first period.

According to an eighth aspect of the disclosure, there is provided the sensor controller, in which the program, when executed by the processor, causes the processor to determine whether the measurement result is equal to or lower than measurement results of the electromagnetic noise in a in plurality of first periods, if the measurement result is equal to or higher than the predetermined value, and select, as the scan frequency of the current time, the frequency with a value farthest from the scan frequency selected the last time, from the frequencies corresponding to the measurement results lower than the predetermined value among the measurement results of the electromagnetic noise in the plurality of first periods if the measurement result is not determined to be equal to or lower than the measurement result of the electromagnetic noise in the first period.

According to a ninth aspect of the disclosure, there is provided the sensor controller, in which the program, when executed by the processor, causes the processor to determine whether the measurement result is equal to or lower than measurement results of the electromagnetic noise in a plurality of first periods, if the measurement result is equal to or higher than the predetermined value, and select, as the scan frequency of the current time, the frequency with a value closest to the scan frequency selected the last time, from the frequencies corresponding to the measurement results lower than the predetermined value among the measurement results of the electromagnetic noise in the plurality of first periods if the measurement result is not determined to be equal to or lower than the measurement result of the electromagnetic noise in the first period.

According to a tenth aspect of the disclosure, there is provided the sensor controller, in which the second predetermined number is 1.

According to an eleventh aspect of the disclosure, there is provided an electronic device including a touch sensor including a plurality of detection electrodes arranged in a plane, wherein the touch sensor, in operation, detects a position of a passive pointer, and a sensor controller including a transmission circuit connected to the touch sensor, wherein the transmission circuit, in operation, transmits a transmission signal to the touch sensor in a plurality of third periods at a predetermined cycle, each of the third periods including a first period for measuring electromagnetic noise and a second period for detecting the position of the passive pointer, a processor, and a memory storing a program that, when executed by the processor, causes the processor to: measure a level of electromagnetic noise at a frequency associated with each of the first period and the second period, select, as a scan frequency that is a frequency of the transmission signal in the second period, one of a first predetermined number of frequencies, and select, as backup frequencies that are frequencies of the transmission signal in the first period, a second predetermined number of frequencies fewer than the first predetermined number of frequencies from one or more frequencies different from the scan frequency among the first predetermined number of frequencies, in each of the third periods and according to a measurement result of the level of the electromagnetic noise at the frequency associated with each of the first period and the second period.

According to a twelfth aspect of the disclosure, there is provided a control method of a sensor controller that controls an operation of a touch sensor detecting a position of a passive pointer, the control method including transmitting a transmission signal to the touch sensor in a plurality of third periods at a predetermined cycle, the third period including a first period for measuring electromagnetic noise and a second period for detecting the position of the passive pointer, measuring a level of electromagnetic noise at a frequency associated with each of the first period and the second period, and selecting, as a scan frequency that is a frequency of the transmission signal in the second period, one of a first predetermined number of frequencies and selecting, as backup frequencies which are frequencies of the transmission signal in the first period, a second predetermined number of frequencies fewer than the first predetermined number of frequencies from one or more frequencies different from the scan frequency among the first predetermined number of frequencies, in each of the third periods and according to a result of the measuring.

According to the present disclosure, the sensor controller can highly efficiently lower the level of the electromagnetic noise of the transmission signal to be transmitted to the touch sensor.

DETAILED DESCRIPTION

Figure 1:
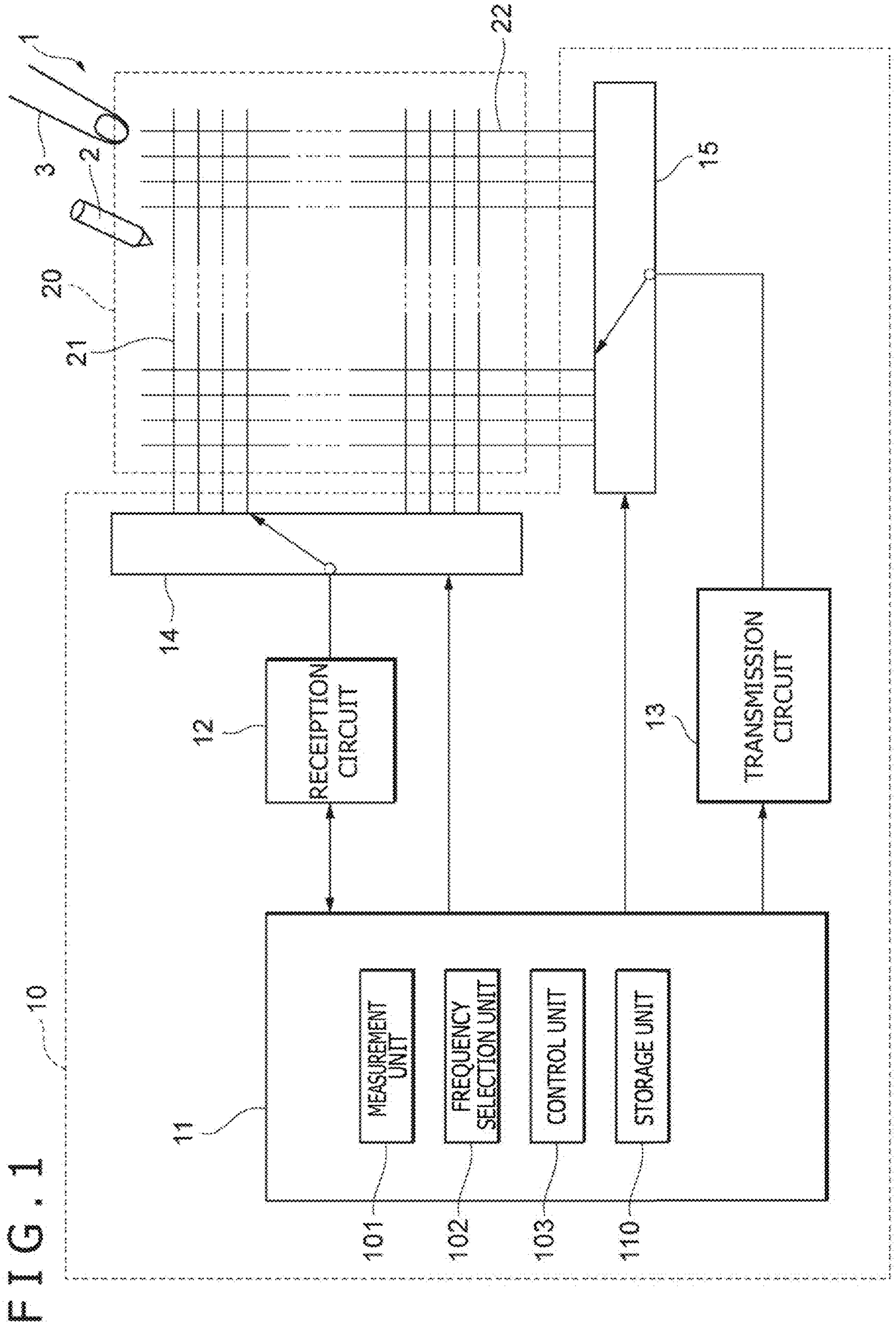
FIG. 1 depicts an example of an electronic device according to an aspect of the present disclosure.

An embodiment of the present disclosure (hereinafter, referred to as a "present embodiment") will be described with reference to the attached drawings. To facilitate the understanding of the description, the same reference signs are provided as much as possible to the same constituent elements and acts in the drawings, and the description will not be repeated.

Circuit Configuration

FIG. 1 depicts an example of an electronic device 1 according to a first embodiment of the present disclosure. The electronic device 1 is a computer owned by a user, and the electronic device 1 includes, for example, a tablet, a smartphone, a personal computer, or the like. The user can move a pen tip of a stylus 2, which is a pen-shaped pointing device, or a finger 3 of the user while pressing the pen tip or the finger 3 against a touch surface included in the electronic device 1 to thereby draw a picture or a character on a display surface of the electronic device 1. The stylus 2 is, for example, a passive touch pen.

The electronic device 1 detects an indicated position of the stylus 2 or the finger 3 and executes various types of information processing according to the detection result. Specifically, the electronic device 1 detects the indicated position of the stylus 2 or the finger 3 according to a signal detected by linear electrodes 21 and 22 provided on the display surface and executes a generation process of digital ink, a display process of a pointer, and the like. The electronic device 1 includes a sensor controller 10 and a touch sensor 20, in addition to a host processor, a memory, and a communication module (which are not illustrated).

The touch sensor 20 is a capacitive sensor including a plurality of detection electrodes arranged in a plane shape. The touch sensor 20 includes, for example, a plurality of X line electrodes (hereinafter, referred to as "linear electrodes 21") for detecting a position on the X axis in the sensor coordinate system, and a plurality of Y line electrodes (hereinafter, referred to as "linear electrodes 22") for detecting a position on the Y axis. The linear electrodes 21 and 22 may include a transparent conductive material containing indium tin oxide (ITO) or may include wire mesh sensors. Note that the touch sensor 20 may be a self-capacitance sensor including block-like electrodes arranged in a two-dimensional grid, instead of the mutual-capacitance sensor.

The sensor controller 10 controls an operation of the touch sensor 20 detecting the position of a passive pointer, such as the stylus 2 and the finger 3. The sensor controller 10 includes, for example, a micro controller unit (MCU) 11, a reception circuit 12, a transmission circuit 13, a detection circuit 14, and an output circuit 15.

The detection circuit 14 is a circuit that selects one of the plurality of linear electrodes 21 or a plurality of linear electrodes 21 adjacent to each other according to an instruction from the MCU 11. The output circuit 15 is a circuit that selects one of the plurality of linear electrodes 22 or a plurality of linear electrodes 22 adjacent to each other according to an instruction from the MCU 11. The output circuit 15 amplifies an input signal transmitted from the MCU 11 to a predetermined voltage to obtain an output signal. The output circuit 15 outputs the output signal to the linear electrode 22.

The linear electrode 22 selected by the output circuit 15 is connected to the transmission circuit 13, and the transmission circuit 13 transmits a transmission signal to the linear electrode 21 through the output circuit 15 according to an instruction from the MCU 11. Specifically, the transmission circuit 13 transmits the transmission signal to the linear electrode 21 in a transmission period according to an instruction from the MCU 11, the transmission period including a noise scan period for measuring electromagnetic noise and a touch scan period for detecting a position that follows the noise scan period. Note that a backup frequency for performing the noise scan is selected as the frequency of the transmission signal transmitted from the transmission circuit 13, in the noise scan period, and a scan frequency for detecting the position is selected as the frequency of the transmission signal, in the touch scan period.

The linear electrode 21 selected by the detection circuit 14 is connected to the reception circuit 12, and the reception circuit 12 receives, from the linear electrode 21, a detection signal generated in the linear electrode 21 when the stylus 2 or the finger 3 comes into contact with the sensor surface of the touch sensor 20. The reception circuit 12 transmits the received detection signal to the MCU 11.

The MCU 11 is a microprocessor including a read-only memory (ROM) and a random access memory (RAM) inside and a processor configured to operate according to a predetermined program. The MCU controls a selection operation of the linear electrode 21 performed by the detection circuit 14, controls a selection operation of the linear electrode 22 performed by the output circuit 15, executes a reading process of a detection signal transmitted from the reception circuit 12 to the MCU, and controls the transmission operation of the transmission signal from the transmission circuit 13 to the touch sensor 20, for example. The MCU includes functional components including, for example, a measurement unit 101, a frequency selection unit 102, a control unit 103, and a storage unit 110. That is, when the processor of the MCU 11 executes the predetermined program, the processor performs the functions of the measurement unit 101, the frequency selection unit 102, the control unit 103, and the storage unit 110 described herein.

In the detection signal transmitted from the reception circuit 12, the measurement unit 101 measures a level of electromagnetic noise at the frequency of the transmission signal transmitted from the transmission circuit 13. Specifically, the measurement unit 101 measures the potential of the detection signal supplied from the linear electrode 21 through the reception unit 12 and sets the measured potential as the level of the electromagnetic noise at the current frequency of the transmission signal. The measurement unit 101 also transmits, to the frequency selection unit 102, the level of the electromagnetic noise at the measured current frequency of the transmission signal.

The frequency selection unit 102 selects the frequency of the transmission signal to be transmitted from the transmission circuit 13, according to the measurement result of the measurement unit 101. Specifically, the frequency selection unit 102 selects, in each transmission period, one of a first predetermined number of frequencies as the scan frequency in the touch scan period according to the measurement result of the electromagnetic noise in the detection signal measured by the measurement unit 101. The frequency selection unit 102 also selects, from the first predetermined number of frequencies, a second predetermined number of frequencies as backup frequencies in the noise scan period, the second predetermined number of frequencies being different from the scan frequency and fewer than the first predetermined number of frequencies. Note that the second predetermined number is 1 in the present embodiment. Note that how the frequency selection unit 102 selects the frequency according to the measurement result of the measurement unit 101 will be described later with reference to FIG. 2, and it will not be described here.

The control unit 103 controls the selection operation of the linear electrode 21 performed by the detection unit circuit 14. Specifically, the control unit 103 controls the operation of the detection circuit 14 to, for example, sequentially select all of the linear electrodes 21 on the touch sensor 20 in the touch scan period and the noise scan period. The control unit 103 also controls the selection operation of the linear electrode 22 performed by the output circuit 15. Specifically, the control unit 103 controls the operation of the output circuit 15 to, for example, sequentially select all of the linear electrodes 22 on the touch sensor 20 in the touch scan period and the noise scan period. The control unit 103 also controls the transmission of the frequency selected by the frequency selection unit 102 to the transmission circuit 13 and the transmission operation of the transmission signal performed by the transmission circuit 13. The control unit 103 also reads the detection signal transmitted from the reception circuit 12 and performs the detection operation of the position on the touch sensor 20. Note that the control unit 103 in the noise scan period may control the operation of the detection circuit 14 and the output circuit 15 to sequentially select some of the linear electrodes 21 and 22 after thinning out the linear electrodes 21 and 22, instead of selecting all of the linear electrodes 21 and 22.

The storage unit 110 stores a program for the operation of the MCU 11, a program for controlling the operation of the transmission circuit 13, the detection circuit 14, and the output circuit 15, a set of frequencies that can be selected as the frequency of the transmission signal, time transition of the level of the electromagnetic noise in the detection signal measured by the measurement unit 101, and the like.

Flow of Series of Operations

Figure 2:
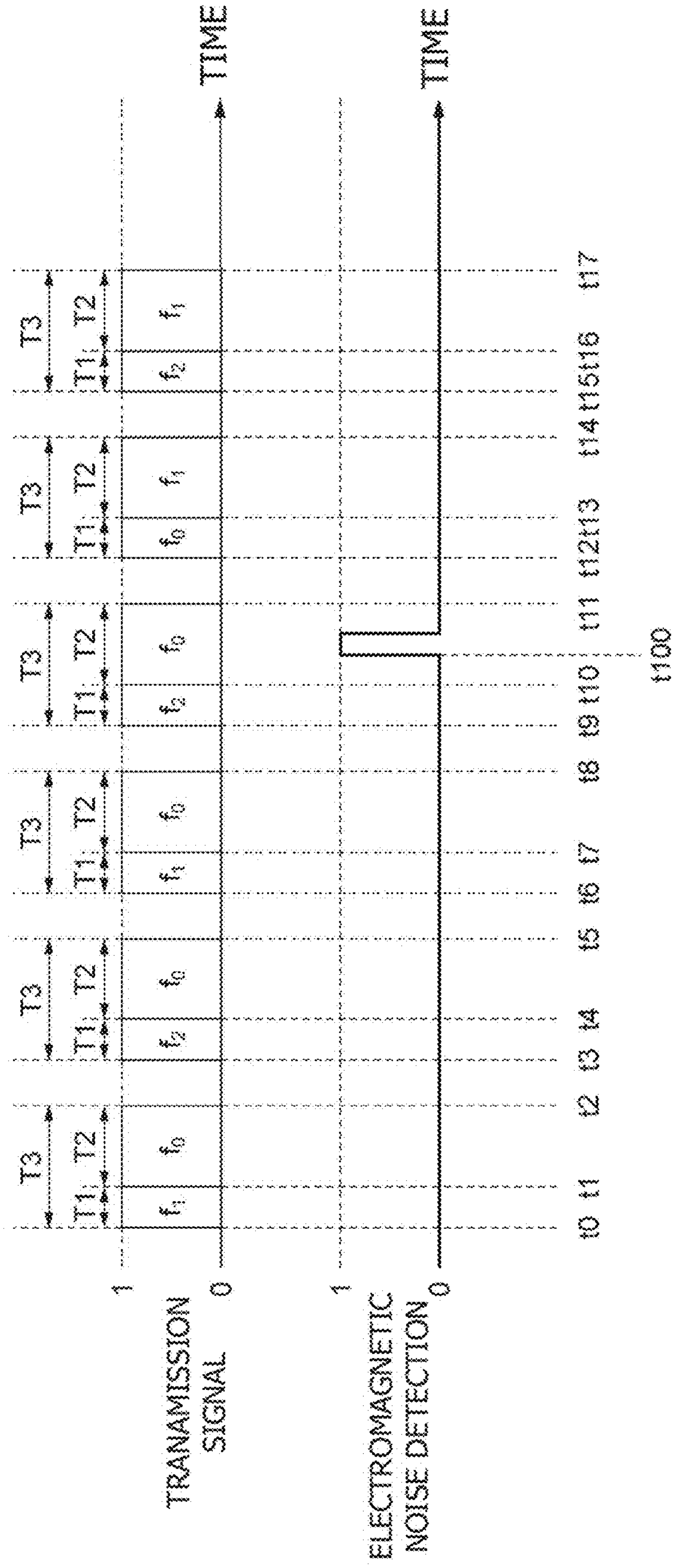
FIG. 2 depicts an example of a timing chart illustrating transition of a frequency used for a transmission signal transmitted to a touch sensor according to an aspect of the present disclosure.

This completes the description of the configuration of the electronic device 1. Next, the transition of the potential of various signals in the electronic device 1 will be described in detail. FIG. 2 depicts an example of a timing chart illustrating the transition of the frequency used for the transmission signal transmitted to the touch sensor 20.

As illustrated in FIG. 2, the transmission circuit 13 transmits the transmission signal to the touch sensor 20 in a transmission period T3. The transmission period T3 includes a noise scan period T1 for the measurement unit 101 to measure the electromagnetic noise at each backup frequency, and a touch scan period T2 for detecting the position that is a period following the noise scan. Note that, in FIG. 2, the first predetermined number of frequencies include three frequencies including frequencies f0, f1, and f2.

At time t0, the transmission circuit 13 refers to the storage unit 110 for the frequency f1 selected as the backup frequency by the frequency selection unit 102 and transmits the transmission signal with the frequency f1 to the touch sensor 20 in the noise scan period T1. The measurement unit 101 measures the level of the electromagnetic noise of the detection signal transmitted from the touch sensor 20 in the noise scan period T1. The measurement unit 101 stores, in the storage unit 110, the measurement result as the level of the electromagnetic noise at the frequency f1 in the cycle of time t0.

Although the control unit 103 is configured to control the operation of the detection circuit 14 and the output circuit 15 to sequentially select all of the linear electrodes 21 and 22 in the present embodiment, the configuration is not limited to this. The control unit 103 may control the operation of the output circuit 15 to thin out the plurality of linear electrodes 21 and 22 and sequentially select only the remaining linear electrodes 21 and 22. Instead of sequentially selecting all of the linear electrodes 21 and 22, the control unit 103 may control the operation of the output circuit 15 to select all of the linear electrodes 21 at the same time at the transmission of the transmission signal from the transmission circuit 13 and may control the operation of the detection circuit 14 to select all of the linear electrodes 22 at the same time at the reception of the detection signal from the reception circuit 12. When the control unit 103 selects all of the linear electrodes 21 at the same time, the control unit 103 may control the operation of the transmission circuit 13 such that a transmission signal encoded by an orthogonal spreading code is transmitted from all of the linear electrodes 21.

At time t1, the transmission circuit 13 refers to the storage unit 110 for the frequency f0 selected as the scan frequency by the frequency selection unit 102 and transmits the transmission signal with the frequency f0 to the touch sensor 20 in the touch scan period T2. The measurement unit 101 measures the level of the electromagnetic noise of the detection signal transmitted from the touch sensor 20 in the touch scan period T2. The measurement unit 101 stores, in the storage unit 110, the measurement result as the level of the electromagnetic noise at the frequency f0 at time t1. The control unit 103 in the touch scan period T2 executes a process of reading the detection signal transmitted from the reception circuit 12, detecting whether the position is indicated by the stylus 2 or the finger 3 on the touch sensor 20, and detecting the indicated position.

At time t2, the frequency selection unit 102 refers to the storage unit 110 and acquires the measurement result of the measurement unit 101 related to the level of the electromagnetic noise at the scan frequency in the touch scan period T2 from time t1 to time t2. The level of the electromagnetic noise at the scan frequency is lower than a predetermined value, and noise is undetected. Therefore, the frequency selection unit 102 continues to select the frequency f0 as the scan frequency. The level of the electromagnetic noise at the scan frequency is lower than the predetermined value, and noise is undetected. Therefore, the frequency selection unit 102 selects, as the backup frequency, the frequency f2 that is a frequency different from the scan frequency and different from the backup frequency measured this time. Note that the details of the selection method of the scan frequency and the backup frequency of the frequency selection unit 102 will be described later with reference to FIGS. 3 to 5, and the details will not be described here.

From time t3 to time t5, the transmission circuit 13, the measurement unit 101, and the frequency selection unit 102 perform operations similar to the operations from time t0 to time t2, respectively, except that the backup frequency has changed from the frequency f1 to the frequency f2. Note that, at time t5, the frequency selection unit 102 selects the frequency f0 as the scan frequency and selects the frequency f1 as the backup frequency.

From time t6 to time t8, the transmission circuit 13, the measurement unit 101, and the frequency selection unit 102 perform operations similar to the operations from time t0 to time t2, except that the backup frequency has changed from the frequency f1 to the frequency f2.

At time t9 and time t10, the transmission circuit 13 and the measurement unit 101 perform operations similar to the operations at time t3 and time t4, respectively, except that the backup frequency has changed from the frequency f1 to the frequency f2. At time t100, the measurement unit 101 detects that the level of the electromagnetic noise at the frequency f0 as the scan frequency is equal to or higher than the predetermined value.

At time t11, the frequency selection unit 102 refers to the storage unit 110 and acquires the measurement result of the measurement unit 101 related to the level of the electromagnetic noise at the frequency f0 as the scan frequency in the touch scan period T2 from time t10 to time t11. The level of the electromagnetic noise at the scan frequency is equal to or higher than the predetermined value. Therefore, the frequency selection unit 102 refers to the storage unit 110 and acquires the level of the electromagnetic noise at the frequency f1 as the backup frequency in the noise scan period T1 from time t6 to time t7 and the level of the electromagnetic noise at the frequency f2 as the backup frequency in the noise scan period T1 from time t9 to time t10.

The frequency selection unit 102 selects, as the scan frequency, the frequency f1 with the lowest level of the electromagnetic noise among the frequencies f0, f1, and f2. The frequency selection unit 102 also selects, as the backup frequency, the frequency f0 that is a frequency different from the frequency f1 selected as the scan frequency and different from the backup frequency measured this time.

From t12 to time t14, the transmission circuit 13, the measurement unit 101, and the frequency selection unit 102 each perform operations similar to the operations from time t0 to time t2, except that the backup frequency has changed to the frequency f0, and that the scan frequency has changed to the frequency f1. Note that, at time t14, the frequency selection unit 102 continues to select the frequency f1 as the scan frequency and selects the frequency f2 as the backup frequency.

From time t15 to time t17, the transmission circuit 13, the measurement unit 101, and the frequency selection unit 102 each perform operations similar to the operations from time t0 to time t2, except that the backup frequency has changed to the frequency f2. Note that, at time t17, the frequency selection unit 102 continues to select the frequency f1 as the scan frequency and selects the frequency f0 as the backup frequency.

Figure 3:
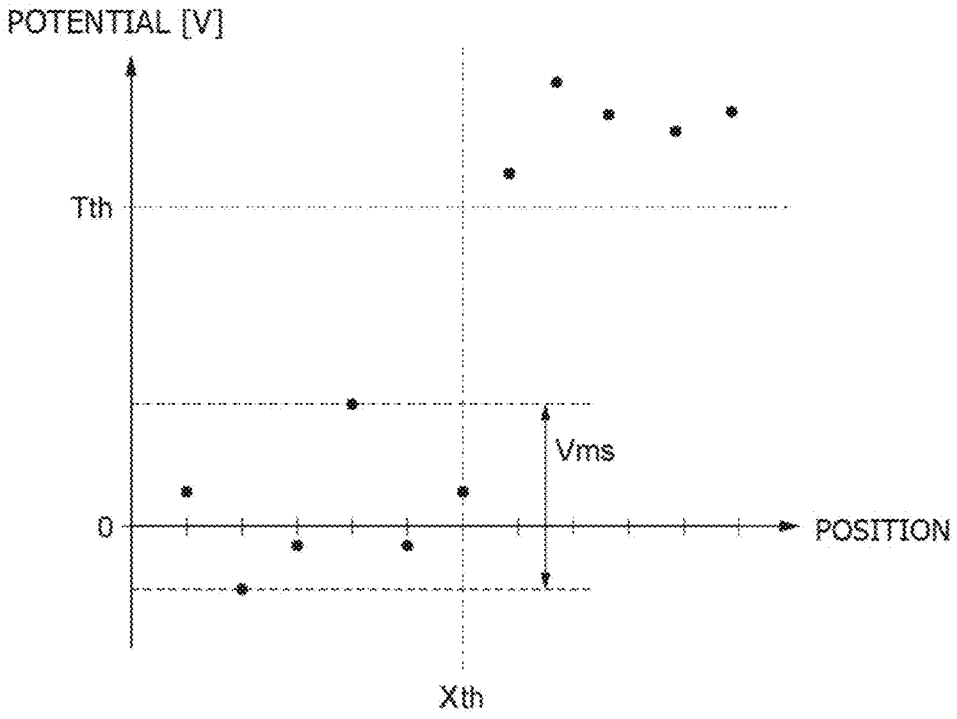
FIG. 3 is a graph illustrating a distribution of a potential detected by a touch sensor through linear electrodes according to an aspect of the present disclosure.

This completes the description of the transition of the potential of various signals in the electronic device 1. Next, the details of the measurement of the level of the electromagnetic noise measured by the measurement unit 101 will be described. FIG. 3 is a graph illustrating a distribution of the potential detected by the touch sensor 20 through the linear electrodes 21 and 22. In FIG. 3, the horizontal axis represents the position in the X line direction in the touch sensor 20 and represents the position where the linear electrode 22 is provided. In FIG. 3, the vertical axis represents the potential of the detection signal transmitted from the linear electrode 21 to the measurement unit 101 through the reception circuit 12.

It is assumed in FIG. 3 that the position is not indicated by the stylus 2 or the finger 3 in an area on the left of a position Xth including the linear electrode 22 provided at the position Xth. It is assumed that the position is indicated by the stylus 2 or the finger 3 in an area on the right of the linear electrode 22 provided at the position Xth.

In FIG. 3, a potential Tth is a threshold for the touch sensor 20 to recognize whether the position is indicated by the stylus 2 or the finger 3. If the potential of the detection signal is equal to or greater than the potential Tth, the control unit 103 determines that the position is indicated at the position indicated by the detected linear electrodes 21 and 22 and detects the indicated position.

In the noise scan period T1, the measurement unit 101 measures the potential of the detection signal and extracts measurement results smaller than the potential Tth. The measurement unit 101 calculates a potential difference Vms that is a difference between a maximum value and a minimum value of the extracted measurement results. The measurement unit 101 stores, in the storage unit 110, the calculated potential difference Vms as the level of the electromagnetic noise at the current time and backup frequency. Similarly, the measurement unit 101 calculates the potential difference Vms in the touch scan period T2 and stores, in the storage unit 110, the calculated potential difference Vms as the level of the electromagnetic noise at the current time and scan frequency.

Figure 4:
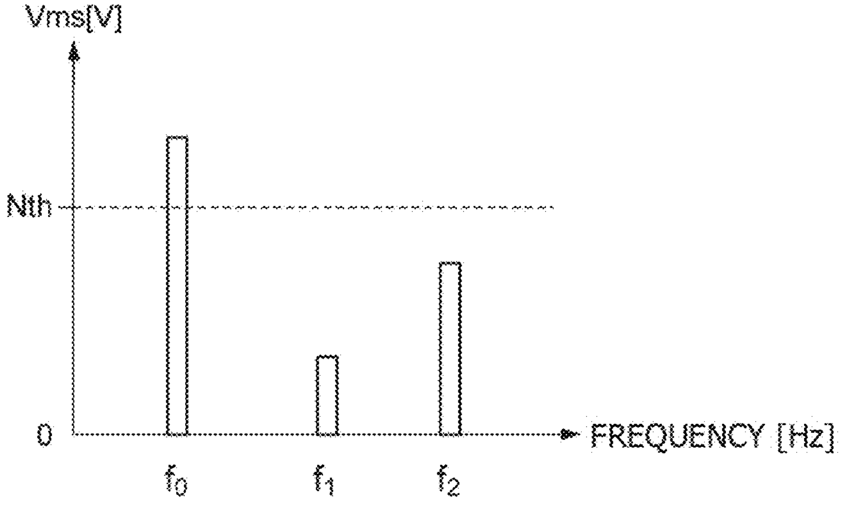
FIG. 4 depicts an example of a level of electromagnetic noise at each frequency used for a transmission signal according to an aspect of the present disclosure.

This completes the description of the details of the measurement of the level of the electromagnetic noise measured by the measurement unit 101. Next, the selection of the frequency by the frequency selection unit 102 will be described with reference to FIG. 4. FIG. 4 depicts an example of the level of the electromagnetic noise at each frequency used for the transmission signal. In FIG. 4, the vertical axis and the horizontal axis represent the level and the frequency of the electromagnetic noise measured by the measurement unit 101, respectively. It is assumed in FIG. 4 that the current scan frequency is the frequency f0.

As illustrated in FIG. 4, the measurement result of the level of the electromagnetic noise at the frequency f0 as the scan frequency is equal to or higher than a predetermined value Nth, and the measurement result is higher than both the measurement results of the levels of the electromagnetic noise at the frequencies f1 and f2 as the backup frequencies. The measurement result of the level of the electromagnetic noise at the frequency f1 as the backup frequency is the lowest among the measurement results of the levels of the electromagnetic noise at the scan frequency and the backup frequencies.

The frequency selection unit 102 first determines whether the level of the electromagnetic noise at the frequency f0 as the current scan frequency is equal to or higher than the predetermined value Nth. If the level of the electromagnetic noise at the frequency f0 as the scan frequency is equal to or higher than the predetermined value Nth, the frequency selection unit 102 determines whether the level of the electromagnetic noise at the frequency f0 is lower than both the levels of the electromagnetic noise at the frequencies f1 and f2 as the backup frequencies. If the frequency selection unit 102 determines that the level of the electromagnetic noise at the frequency f0 is equal to or higher than one of the levels of the electromagnetic noise at the frequencies f1 and f2, the frequency selection unit 102 selects, as the scan frequency, one of the frequencies f1 and f2 with the lowest level of the electromagnetic noise. The frequency selection unit 102 further selects, as the backup frequency, one of the frequencies f0 and f2 not selected as the scan frequency among the frequencies f0 to f2.

If the level of the electromagnetic noise at the frequency f0 as the scan frequency is lower than the predetermined value Nth or if the level of the electromagnetic noise at the frequency f0 is lower than both the levels of the electromagnetic noise at the frequencies f1 and f2 as the backup frequencies, the frequency selection unit 102 continues to select the same frequency f0 as the scan frequency. As long as the condition that the level of the electromagnetic noise at the frequency f0 is lower than the predetermined value Nth or the condition that the level of the electromagnetic noise at the frequency f0 is lower than both the levels of the electromagnetic noise at the frequencies f1 and f2 is satisfied, the frequency selection unit 102 sequentially selects, as the backup frequencies, unselected frequencies among the plurality of backup frequencies in each transmission period T3.

Note that, in FIG. 4, the level of the electromagnetic noise at the frequency f0 as the scan frequency is higher than the predetermined value Nth and equal to or higher than one of the levels of the electromagnetic noise at the frequencies f1 and f2 as the backup frequencies. Therefore, the frequency selection unit 102 selects, from the frequencies f1 and f2 as the backup frequencies, the frequency f1 as the scan frequency, in which the level of the electromagnetic noise is the lowest.

Figure 5:
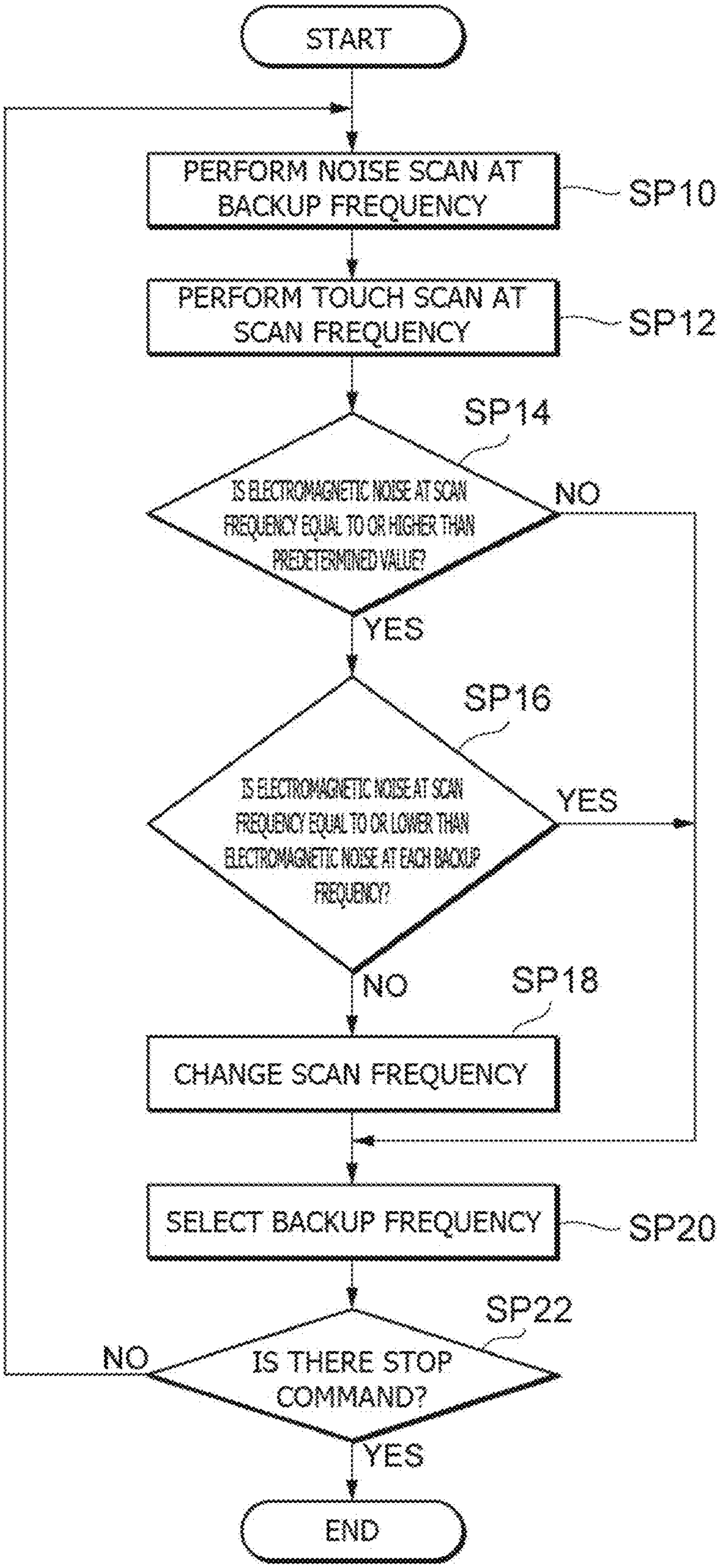
FIG. 5 is a flow chart illustrating an example of a flow of a series of processes executed by a sensor controller according to an aspect of the present disclosure.

This completes the description of the selection of the frequency by the frequency selection unit 102. Next, the flow of a series of processes of the sensor controller 10 will be described in detail. FIG. 5 is a flow chart illustrating an example of the flow of a series of processes executed by the sensor controller 10.

SP10

The measurement unit 101 in the sensor controller 10 measures the level of the electromagnetic noise at the current backup frequency in the noise scan period T1. The sensor controller 10 stores, in the storage unit 110, the measurement result of the level of the electromagnetic noise measured by the measurement unit 101 as well as the information related to time and backup frequency. The process moves to the process of SP12.

SP12

The measurement unit 101 in the sensor controller 10 measures the level of the electromagnetic noise at the current scan frequency in the touch scan period T2. The sensor controller 10 stores, in the storage unit 110, the measurement result of the level of the electromagnetic noise measured by the measurement unit 101 as well as the information related to time and scan frequency. The process moves to the process of SP14.

SP14

The frequency selection unit 102 in the sensor controller 10 acquires, from the storage unit 110, the measurement result of the level of the electromagnetic noise at the current scan frequency in the most recent touch scan period T2. The frequency selection unit 102 in the sensor controller 10 determines whether the acquired measurement result is equal to or higher than the predetermined value. If the determination is affirmative, the process moves to the process of SP16. In contrast, if the determination is negative, the process moves to the process of SP20.

SP16

The frequency selection unit 102 in the sensor controller 10 acquires, from the storage unit 110, the measurement results of the levels of the electromagnetic noise at the backup frequencies. The frequency selection unit 102 in the sensor controller 10 determines whether the level of the electromagnetic noise in the most recent touch scan period T2 is equal to or lower than the values of the levels of the electromagnetic noise at the backup frequencies. If the determination is affirmative, the process moves to the process of SP20. In contrast, if the determination is negative, the process moves to the process of SP18.

SP18

The frequency selection unit 102 in the sensor controller 10 selects, from the backup frequencies, the frequency with the lowest measurement result of the level of the electromagnetic noise and changes the scan frequency to the selected frequency. The process moves to the process of SP20.

SP20

The frequency selection unit 102 in the sensor controller 10 selects, from the backup frequencies, the frequency with the lowest measurement result of the level of the electromagnetic noise and changes the scan frequency to the selected frequency. The process moves to the process of SP22.

SP22

The control unit 103 in the sensor controller 10 determines whether a stop command for stopping the operation of the position detection by the sensor controller 10 and the touch sensor 20 is transmitted from an external constituent element or the like of the sensor controller 10 provided on the electronic device 1. If the determination is negative, the process moves to the process of SP20. In contrast, if the determination is affirmative, the series of processes illustrated in FIG. 5 end.

Effects

In the present embodiment, the sensor controller 10 that controls the operation of the touch sensor 20 detecting the position of the stylus 2 (passive pointer) includes the transmission circuit 13 that transmits the transmission signal to the touch sensor 20 in the transmission period T3 (third period) at the predetermined cycle, the transmission period T3 including the noise scan period T1 (first period) for measuring the electromagnetic noise and the touch scan period T2 (second period) for detecting the position, and the measurement unit 101 that measures the level of the electromagnetic noise at the frequency associated with each period in the noise scan period T1 and the touch scan period T2. The sensor controller 10 further includes the frequency selection unit 102 that selects, as the scan frequency which is the frequency of the transmission signal in the touch scan period T2, one of the first predetermined number of frequencies and that selects, as the backup frequencies which are the frequencies of the transmission signal in the noise scan period T1, the second predetermined number of frequencies fewer than the first predetermined number of frequencies from the frequencies different from the scan frequency among the first predetermined number of frequencies, in each transmission period T3 and according to the measurement result of the measurement unit 101.

According to the configuration, the sensor controller 10 selects, as the backup frequencies in the noise scan period T1, the frequencies different from the scan frequency in the touch scan period T2. Therefore, the sensor controller 10 measures the level of the electromagnetic noise without the overlap of the scan frequency and the backup frequencies. The sensor controller 10 can highly efficiently lower the level of the electromagnetic noise of the transmission signal transmitted to the touch sensor 20.

In the present embodiment, the frequency selection unit 102 sequentially selects, as the backup frequencies, the second predetermined number of frequencies from the frequencies different from the scan frequency among the first predetermined number of frequencies in each transmission period T3 (third period).

Therefore, the sensor controller 10 sequentially selects the backup frequencies from the frequencies different from the scan frequency. The sensor controller 10 can more highly efficiently lower the level of the electromagnetic noise of the transmission signal.

In the present embodiment, the frequency selection unit 102 selects, as the scan frequency of this time, one frequency different from the scan frequency selected last time if the measurement result of the electromagnetic noise in the touch scan period T2 (second period) measured by the measurement unit 101 is equal to or higher than the predetermined value Nth.

Therefore, the sensor controller 10 can highly efficiently and highly accurately lower the level of the electromagnetic noise of the transmission signal.

In the present embodiment, the frequency selection unit 102 determines whether the measurement result is equal to or lower than the measurement result of the electromagnetic noise in the noise scan period T1 (first period) measured by the measurement unit 101 if the measurement result is equal to or higher than the predetermined value Nth and again selects, as the scan frequency of this time, the scan frequency selected last time if the determination is affirmative.

According to the configuration, even if the measurement result of the level of the electromagnetic noise in the touch scan period T2 is equal to or higher than the predetermined value Nth, the sensor controller 10 maintains the scan frequency if the measurement result is equal to or lower than the measurement result of the level of the electromagnetic noise in the noise scan period T1. Therefore, the sensor controller 10 can more highly accurately lower the level of the electromagnetic noise of the transmission signal.

In the present embodiment, the second predetermined number is 1.

According to the configuration, the sensor controller 10 measures the level of the electromagnetic noise at one backup frequency in the noise scan period T1, and the sensor controller 10 can reserve much time for the touch scan period T2 in the transmission period T3. Therefore, the sensor controller 10 can highly efficiently and highly accurately lower the level of the electromagnetic noise of the transmission signal and highly accurately detect the indicated position on the touch sensor 20.

Modifications

Note that the present disclosure is not limited to the embodiment. That is, those skilled in the art can appropriately change the design of the embodiment, and the changed embodiment is also included in the scope of the present disclosure as long as the changed embodiment has the features of the present disclosure. In addition, the elements included in the embodiment and modifications described later can be combined if technically possible, and the combinations are also included in the scope of the present disclosure as long as the combinations have the features of the present disclosure.

For example, although the sensor controller 10 is configured to measure the level of the electromagnetic noise at one backup frequency in one transmission period T3 in the embodiment, the configuration is not limited to this. The sensor controller 10 may measure the levels of the electromagnetic noise at a plurality of backup frequencies in one transmission period T3.

The frequency selection unit 102 in the sensor controller 10 may select, as the backup frequencies, two or more second predetermined number of frequencies fewer than the first predetermined number of frequencies from the frequencies different from the scan frequency among the first predetermined number of frequencies, in each transmission period T3 and according to the measurement result of the measurement unit 101. That is, the second predetermined number may be 2 or more. In this case, the frequency selection unit 102 sequentially selects, in each transmission period T3, the second predetermined number of frequencies from the frequencies excluding the scan frequency from the first predetermined number of frequencies.

Figure 6:
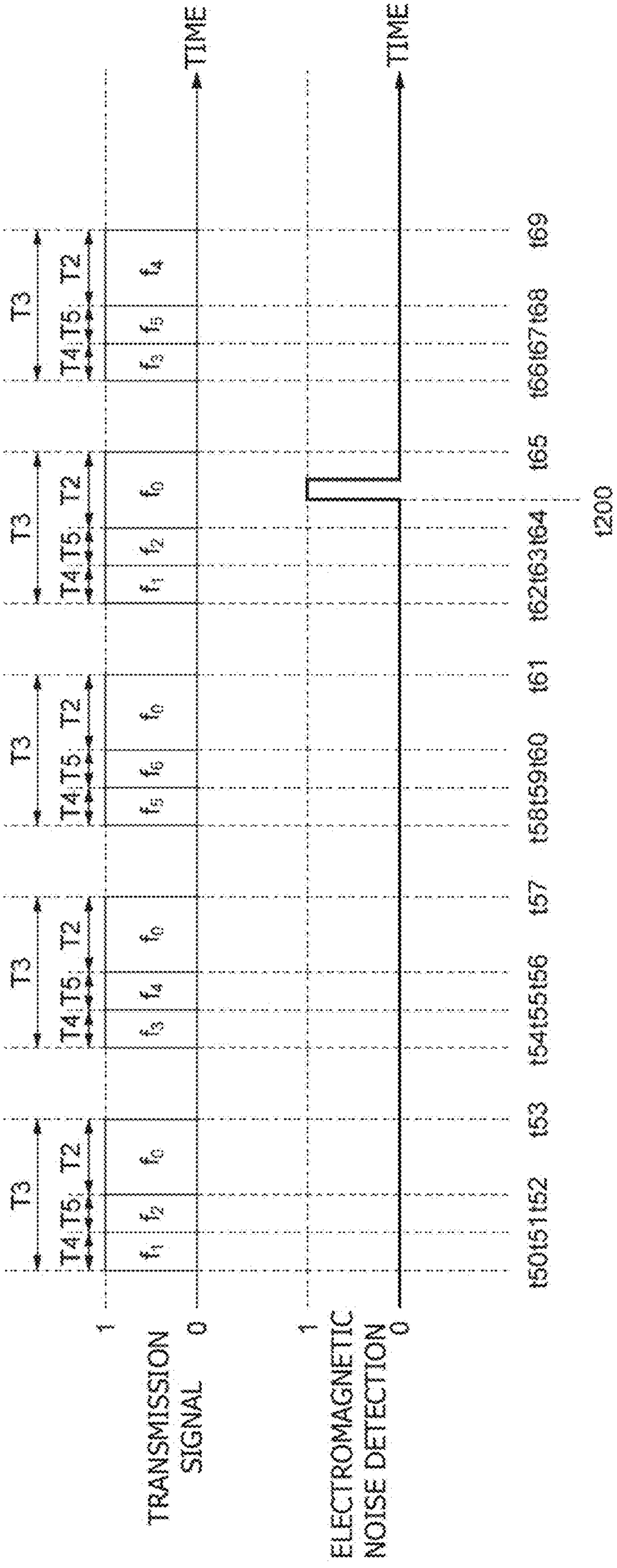
FIG. 6 depicts another example of a timing chart illustrating transition of a frequency used for a transmission signal transmitted to a touch sensor according to an aspect of the present disclosure.

Here, an operation of the sensor controller 10 in the case of measuring the levels of the electromagnetic noise at a plurality of backup frequencies in one transmission period T3 will be described with reference to FIG. 6. FIG. 6 depicts another example of the timing chart illustrating transition of the frequency used for the transmission signal transmitted to the touch sensor 20.

As illustrated in FIG. 6, the transmission circuit 13 transmits the transmission signal to the touch sensor 20 in the transmission period T3. The transmission period T3 includes a plurality of noise scan periods T4 and T5 for the measurement unit 101 to measure the electromagnetic noise at each backup frequency, and the touch scan period T2. In FIG. 6, it is assumed that the first predetermined number of frequencies include seven frequencies including frequencies f0 to f6. In FIG. 6, it is assumed that the second predetermined number is 2.

At time t50, the transmission circuit 13 refers to the storage unit 110 for the frequency f1 selected as the backup frequency by the frequency selection unit 102 and transmits the transmission signal with the frequency f1 to the touch sensor 20 in the noise scan period T4. The measurement unit 101 measures the level of the electromagnetic noise of the detection signal transmitted from the touch sensor 20 in the noise scan period T4. The measurement unit 101 stores, in the storage unit 110, the measurement result as the level of the electromagnetic noise at the frequency f1 in the cycle of time t50.

At time t51, the sensor controller 10 performs an operation similar to the operation at time t50, except that the referenced frequency is the frequency f2. That is, the transmission circuit 13 transmits the transmission signal with the frequency f2 to the touch sensor 20 in the noise scan period T5. The measurement unit 101 measures the level of the electromagnetic noise of the detection signal transmitted from the touch sensor 20 in the noise scan period T5. The measurement unit 101 stores, in the storage unit 110, the measurement result as the level of the electromagnetic noise at the frequency f2 in the cycle of time t51.

At time t52, the transmission circuit 13 transmits the transmission signal with the frequency f0 to the touch sensor 20. Note that the operation of the sensor controller 10 in the touch scan period T2 from time t52 to time t53 is similar to the operation of the case where the second predetermined number is 1 as described in FIG. 2, and the description will not be repeated.

At time t53, the frequency selection unit 102 refers to the storage unit 110 and acquires the measurement result of the measurement unit 101 related to the level of the electromagnetic noise at the scan frequency in the touch scan period T2 from time t52 to time t53. The level of the electromagnetic noise at the scan frequency is lower than the predetermined value, and noise is undetected. Therefore, the frequency selection unit 102 continues to select the frequency f0 as the scan frequency. The level of the electromagnetic noise at the scan frequency is lower than the predetermined value, and noise is undetected. Therefore, the frequency selection unit 102 selects, as the backup frequencies, the frequencies f3 and f4 that are frequencies different from the scan frequency and different from the two backup frequencies measured this time.

From time t54 to time t57, the transmission circuit 13, the measurement unit 101, and the frequency selection unit 102 each perform operations similar to the operations from time t50 to time t53, except that the backup frequencies have changed from the frequencies f1 and f2 to the frequencies f3 and f4. Note that, at time t57, the frequency selection unit 102 selects the frequency f0 as the scan frequency and selects the frequencies f5 and f6 as the backup frequencies.

From time t58 to time t61, the transmission circuit 13, the measurement unit 101, and the frequency selection unit 102 perform operations similar to the operations from time t54 to time t57, except that the backup frequencies have changed from the frequencies f3 and f4 to the frequencies f5 and f6. Note that, at time t61, the frequency selection unit 102 selects the frequency f0 as the scan frequency and selects the frequencies f1 and f2 as the backup frequencies.

From time t62 to time t64, the transmission circuit 13 and the measurement unit 101 perform operations similar to the operations from time t50 to time t52. At time t200, the measurement unit 101 detects that the level of the electromagnetic noise at the frequency f0 as the scan frequency is equal to or higher than the predetermined value.

At time t65, the frequency selection unit 102 refers to the storage unit 110 and acquires the measurement result of the measurement unit 101 related to the level of the electromagnetic noise at the frequency f0 as the scan frequency in the touch scan period T2 from time t64 to time t65. The level of the electromagnetic noise at the scan frequency is equal to or higher than the predetermined value. Therefore, the frequency selection unit 102 refers to the storage unit 110. The frequency selection unit 102 acquires the levels of the electromagnetic noise at the frequencies f1 to f6 as the backup frequencies measured in the noise scan periods T4 and T5 from time t54 to time t65.

The frequency selection unit 102 selects, as the scan frequency, the frequency f4 with the lowest level of the electromagnetic noise among the frequencies f0 to f6. The frequency selection unit 102 also selects, as the backup frequencies, the frequencies f3 and f5 that are frequencies different from the frequency f4 selected as the scan frequency and different from the backup frequencies measured this time.

From time t66 to time t69, the transmission circuit 13, the measurement unit 101, and the frequency selection unit 102 perform operations similar to the operations from time t50 to time t53, except that the backup frequencies have changed from the frequencies f1 and f2 to the frequencies f3 and f5, and the scan frequency has changed from the frequency f0 to the frequency f4. Note that, at time t61, the frequency selection unit 102 selects the frequency f0 as the scan frequency and selects the frequencies f1 and f2 as the backup frequencies.

According to the configuration, the sensor controller 10 selects a plurality of frequencies as the backup frequencies, and this increases the possibility that a frequency with a low level of electromagnetic noise can be selected as the scan frequency when the level of the electromagnetic noise at the scan frequency becomes equal to or higher than the predetermined value Nth. Therefore, the sensor controller 10 can more highly accurately lower the level of the electromagnetic noise of the transmission signal.

If the measurement result is equal to or higher than the predetermined value Nth, the frequency selection unit 102 may determine whether the measurement result is equal to or lower than the measurement results of the electromagnetic noise in the plurality of noise scan periods T4 and T5 (first periods) measured by the measurement unit 101. If the determination is affirmative, the frequency selection unit 102 may again select the scan frequency selected last time as the scan frequency of this time.

According to the configuration, the sensor controller 10 maintains the scan frequency if the measurement result of the level of the electromagnetic noise at the scan frequency is the lowest among the scan frequency and the plurality of backup frequencies. Therefore, the sensor controller 10 can more highly accurately lower the level of the electromagnetic noise of the transmission signal.

If the measurement result is equal to or higher than the predetermined value Nth, the frequency selection unit 102 determines whether the measurement result is equal to or lower than the measurement results of the electromagnetic noise in the plurality of noise scan periods T4 and T5 (first periods) measured by the measurement unit 101. If the determination is negative, the frequency selection unit 102 selects, as the scan frequency of this time, the frequency corresponding to the measurement result with the lowest value among the measurement results of the electromagnetic noise in the plurality of noise scan periods T4 and T5.

According to the configuration, the sensor controller 10 selects, as the scan frequency, the frequency with the lowest measurement result of the level of the electromagnetic noise in the plurality of backup frequencies among the scan frequency and the plurality of backup frequencies. Therefore, the sensor controller 10 can more highly accurately lower the level of the electromagnetic noise of the transmission signal.

Although the electronic device 1 is configured to detect the position indicated by the passive pointer, such as the stylus 2 and the finger 3, in the embodiment, the configuration is not limited to this. The electronic device 1 may detect the position indicated by, for example, an active capacitance type stylus. The active capacitance type stylus includes, for example, a power supply, a communication circuit, and an electrode for detecting an uplink signal transmitted at a predetermined cycle from the electronic device 1 and transmitting a downlink signal at an instructed time according to the time of the detected uplink signal. In addition to the transmission of the transmission signal, the electronic device 1 transmits the uplink signal to the touch sensor 20 and receives the downlink signal from the touch sensor 20.

According to the configuration, the sensor controller 10 can highly efficiently lower the level of the electromagnetic noise of the transmission signal even when the position is indicated by the passive pointer in the touch sensor 20.

Although the frequency selection unit 102 is configured to select the scan frequency and the backup frequencies from the first predetermined number of frequencies set in advance in the embodiment, the configuration is not limited to this. The frequency selection unit 102 may be able to change candidates for the first predetermined number of frequencies according to, for example, the environment of use of the electronic device 1, the type of the electronic device 1, and the type of the touch sensor 20 mounted on the electronic device 1. Examples of the environment of use of the electronic device 1 include the temperature, the humidity, the atmospheric pressure, and the cleanliness of the space provided with the electronic device 1 and the state of electromagnetic noise in the space.

Specifically, the storage unit 110 stores a set of a plurality of frequencies associated with the environments of use of the electronic device 1. The storage unit 110 also stores the state related to the current set of frequencies configured according to a setting command from the operator of the electronic device 1, an external device that can communicate with the electronic device 1, or the like.

To select the scan frequency and the backup frequencies, the frequency selection unit 102 refers to the storage unit 110 and selects one scan frequency from the predetermined number of frequencies associated with the set of frequencies, according to the configured set of frequencies. The frequency selection unit 102 sequentially selects, as the backup frequencies, frequencies other than the scan frequency from the predetermined number of frequencies in each transmission period.

According to the configuration, the sensor controller 10 can change the candidates for the frequencies according to the environment of use of the electronic device 1, the type of the electronic device 1, the type of the touch sensor 20 mounted on the electronic device 1, and the like. Therefore, the sensor controller 10 can highly accurately and highly efficiently lower the level of the electromagnetic noise of the transmission signal.

In the embodiment, although the frequency selection unit 102 is configured to select, as the scan frequency, the frequency with the lowest level of the electromagnetic noise among the backup frequencies if the level of the electromagnetic noise at the scan frequency is higher than the predetermined value Nth and equal to or higher than one of the levels of the electromagnetic noise at the backup frequencies, the configuration is not limited to this. The frequency selection unit 102 may select, as the scan frequency, the frequency with the highest priority in relation to preset priorities, among the backup frequencies with the levels of the electromagnetic noise lower than the predetermined value Nth, for example.

A program for measuring the electronic device 1 stored in the storage unit 110 or a device different from the electronic device 1 and connected to the electronic device 1 in a manner that the device can communicate with the electronic device 1 sets the priorities in advance according to preliminary measurement results at the frequencies in the frequency set stored in the storage unit 110, and the priorities are stored in the storage unit 110, for example. "Preliminary" means before the electronic device 1 or the touch sensor 20 is used by the user, and "preliminary" is, for example, at the shipment of the product or at the change in the setting. In relation to the preliminarily measured electromagnetic noise, [1] the lower the peak is, the higher the priority may be, [2] the narrower the peak width is, the higher the priority may be, [3] the more uniform the distribution of noise is, the higher the priority may be, or [4] the higher the reproducibility of the electromagnetic noise is, the higher the priority may be, for example. After the preliminary measurement by the touch sensor 20, the lower the reproducibility of the electromagnetic noise in relation to the measured electromagnetic noise is, the higher the priority may be set, for example.

According to the configuration, the frequency selection unit 102 in the sensor controller 10 can select, as the scan frequency, a frequency with a low level of electromagnetic noise suitable for the characteristics related to individual electromagnetic noises of the electronic device 1.

If the level of the electromagnetic noise at the scan frequency is higher than the predetermined value Nth and equal to or higher than one of the levels of the electromagnetic noise at the backup frequencies, the frequency selection unit 102 may select, as the scan frequency, the frequency with a value farthest from the current scan frequency among the backup frequencies with the levels of the electromagnetic noise lower than the predetermined value Nth.

According to the configuration, the frequency selection unit 102 in the sensor controller 10 selects, as the scan frequency, a frequency far from the current scan frequency with a high level of electromagnetic noise. Therefore, the sensor controller 10 can select, as the scan frequency, a frequency with a level of electromagnetic noise more expected to be low, from among the backup frequencies.

If the level of the electromagnetic noise at the scan frequency is higher than the predetermined value Nth and equal to or higher than one of the levels of the electromagnetic noise at the backup frequencies, the frequency selection unit 102 may select, as the scan frequency, the frequency with a value closest to the current scan frequency among the backup frequencies with the levels of the electromagnetic noise lower than the predetermined value Nth.

According to the configuration, the frequency selection unit 102 in the sensor controller 10 selects, as the scan frequency, the frequency closest to the current scan frequency with a high level of electromagnetic noise. Therefore, the sensor controller 10 can reduce the time it takes to change the scan frequency and can simplify the circuit configuration.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A sensor controller that controls an operation of a touch sensor that detects a position of a passive pointer, the sensor controller comprising:

- a transmission circuit that, in operation, transmits a transmission signal to the touch sensor in a plurality of third periods, each of the third periods including a first period for measuring electromagnetic noise and a second period for detecting the position of the passive pointer;
- a processor; and
- a memory storing a program that, when executed by the processor, causes the processor to:
  - measure a level of electromagnetic noise at a frequency associated with the first period and a level of electromagnetic noise at a frequency associated with the second period; and
  - select, as a scan frequency of the transmission signal in the second period, the frequency associated with the first period or the frequency associated with the second period according to a measurement result of the level of the electromagnetic noise at the frequency associated with the first period and the level of the electromagnetic noise at the frequency associated with the second period.

2. The sensor controller according to claim 1, wherein the program, when executed by the processor, causes the processor to sequentially select, as backup frequencies, one or more frequencies different from the scan frequency in each of the third periods.

3. The sensor controller according to claim 2, wherein the program, when executed by the processor, causes the processor to select, as the scan frequency of a current time, one frequency different from the scan frequency selected a last time, if the measurement result of the level of the electromagnetic noise at the frequency associated with the second period is equal to or higher than a predetermined value.

4. The sensor controller according to claim 3, wherein the program, when executed by the processor, causes the processor to determine whether the measurement result is equal to or lower than the measurement result of the level of the electromagnetic noise at the frequency associated with the first period, if the measurement result is equal to or higher than the predetermined value, and again select, as the scan frequency of the current time, the scan frequency selected the last time if the measurement result is determined to be equal to or lower than the measurement result of the electromagnetic noise at the frequency associated with the first period.

5. The sensor controller according to claim 3, wherein the program, when executed by the processor, causes the processor to determine whether the measurement result is equal to or lower than measurement results of the electromagnetic noise in a plurality of first periods, if the measurement result is equal to or higher than the predetermined value, and again select, as the scan frequency of the current time, the scan frequency selected the last time if the measurement result is determined to be equal to or lower than the measurement result of the electromagnetic noise at the frequency associated with the first period.

6. The sensor controller according to claim 3, wherein the program, when executed by the processor, causes the processor to determine whether the measurement result is equal to or lower than measurement results of the electromagnetic noise in a plurality of first periods, if the measurement result is equal to or higher than the predetermined value, and select, as the scan frequency of the current time, a frequency corresponding to the measurement result with a lowest value among the measurement results of the electromagnetic noise in the plurality of first periods if the measurement result is not determined to be equal to or lower than the measurement result of the electromagnetic noise at the frequency associated with the first period.

7. The sensor controller according to claim 3, wherein the program, when executed by the processor, causes the processor to determine whether the measurement result is equal to or lower than measurement results of the electromagnetic noise in a plurality of first periods, if the measurement result is equal to or higher than the predetermined value, and select, as the scan frequency of the current time, a frequency with a highest priority in relation to priorities set in advance according to preliminary measurement results related to the level of the electromagnetic noise, from the one or more frequencies different from the scan frequency among a first predetermined number of frequencies if the measurement result is not determined to be equal to or lower than the measurement result of the electromagnetic noise at the frequency associated with the first period.

8. The sensor controller according to claim 3, wherein the program, when executed by the processor, causes the processor to determine whether the measurement result is equal to or lower than measurement results of the electromagnetic noise in a plurality of first periods, if the measurement result is equal to or higher than the predetermined value, and select, as the scan frequency of the current time, a frequency with a value farthest from the scan frequency selected the last time, from the frequencies corresponding to the measurement results lower than the predetermined value among the measurement results of the electromagnetic noise in the plurality of first periods if the measurement result is not determined to be equal to or lower than the measurement result of the electromagnetic noise at the frequency associated with the first period.

9. The sensor controller according to claim 3, wherein the program, when executed by the processor, causes the processor to determine whether the measurement result is equal to or lower than measurement results of the electromagnetic noise in a plurality of first periods, if the measurement result is equal to or higher than the predetermined value, and select, as the scan frequency of the current time, a frequency with a value closest to the scan frequency selected the last time, from the frequencies corresponding to the measurement results lower than the predetermined value among the measurement results of the electromagnetic noise in the plurality of first periods if the measurement result is not determined to be equal to or lower than the measurement result of the electromagnetic noise at the frequency associated with the first period.

10. An electronic device comprising:

a touch sensor including a plurality of detection electrodes arranged in a plane, wherein the touch sensor, in operation, detects a position of a passive pointer; and a sensor controller including:

- a transmission circuit connected to the touch sensor, wherein the transmission circuit, in operation, transmits a transmission signal to the touch sensor in a plurality of third periods, each of the third periods including a first period for measuring electromagnetic noise and a second period for detecting the position of the passive pointer;
- a processor; and
- a memory storing a program that, when executed by the processor, causes the processor to:
  - measure a level of electromagnetic noise at a frequency associated with the first period and a level of electromagnetic noise at a frequency associated with the second period, and
  - select, as a scan frequency of the transmission signal in the second period, the frequency associated with the first period or the frequency associated with the second period according to a measurement result of the level of the electromagnetic noise at the frequency associated with the first period and the level of the electromagnetic noise at the frequency associated with the second period.

11. A control method of a sensor controller that controls an operation of a touch sensor detecting a position of a passive pointer, the control method comprising:

transmitting a transmission signal to the touch sensor in a plurality of third periods, each of the third periods including a first period for measuring electromagnetic noise and a second period for detecting the position of the passive pointer;

measuring a level of electromagnetic noise at a frequency associated with the first period and a level of electromagnetic noise at a frequency associated with the second period; and selecting, as a scan frequency of the transmission signal in the second period, the frequency associated with the first period or the frequency associated with the second period according to a result of the measuring.

* * * * *